(12) United States Patent
Taneda et al.

(10) Patent No.: US 9,255,320 B2
(45) Date of Patent: Feb. 9, 2016

(54) THIN FILM SUPERCONDUCTING WIRE AND SUPERCONDUCTING CABLE CONDUCTOR

(75) Inventors: Takahiro Taneda, Osaka (JP); Tatsuoki Nagaishi, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 1035 days.

(21) Appl. No.: 13/133,274

(22) PCT Filed: Dec. 3, 2009

(86) PCT No.: PCT/JP2009/070302
§ 371 (c)(1),
(2), (4) Date: Jun. 7, 2011

(87) PCT Pub. No.: WO2010/103699
PCT Pub. Date: Sep. 16, 2010

(65) Prior Publication Data
US 2011/0244234 A1  Oct. 6, 2011

(30) Foreign Application Priority Data

Mar. 11, 2009  (JP) ................. 2009-057870

(51) Int. Cl.
*H01B 12/00*  (2006.01)
*C23C 14/08*  (2006.01)
*C23C 14/02*  (2006.01)
(Continued)

(52) U.S. Cl.
CPC ............. *C23C 14/087* (2013.01); *C23C 14/024* (2013.01); *C23C 14/584* (2013.01);
(Continued)

(58) Field of Classification Search
CPC ....... H01L 39/02; H01L 39/143; H01L 39/24; H01L 39/248; H01L 39/2425; H01L 39/2435; H01L 39/2454; H01L 39/2458; H01L 39/2461; H01B 12/02; H01B 12/06; Y10S 505/74; Y02E 40/642; C23C 28/023; C23C 28/322; C23C 28/42

USPC ......... 505/150, 230, 236–238, 430, 434, 470, 505/472, 473, 704, 818; 428/457, 469, 698, 428/699, 701, 702, 930; 174/125.1; 29/599
See application file for complete search history.

(56) References Cited

U.S. PATENT DOCUMENTS 4,815,940 A       3/1989   Le Shane et al.
2001/0040100 A1*  11/2001  Wang ............................ 205/220
(Continued)

FOREIGN PATENT DOCUMENTS

CN  101036244 A  9/2007
CN  101268523 A  9/2008
(Continued)

*Primary Examiner* — Paul Wartalowicz
(74) *Attorney, Agent, or Firm* — Drinker Biddle & Reath LLP

(57) ABSTRACT

A thin film superconducting wire with a copper plating thin film produced on a surface of a laminated structure is inferior in bending properties to a thin film superconducting wire having no copper plating thin film. Therefore, a thin film superconducting wire according to the present invention is a thin film superconducting wire including a laminated structure having a substrate, a buffer layer located on one of main surfaces of the substrate, and a superconducting layer located on a main surface of the buffer layer opposite to a main surface facing the substrate. The thin film superconducting wire further includes a copper plating thin film covering an outer periphery of the laminated structure, a residual stress within the copper plating thin film serving as a compression stress. The laminated structure may have a sputtered silver layer. A silver covering layer covering the outer periphery of the laminated structure may be further provided between the copper plating thin film and the laminated structure.

5 Claims, 6 Drawing Sheets

(51) Int. Cl.
*C23C 14/58* (2006.01)
*C23C 28/02* (2006.01)
*C25D 5/34* (2006.01)
*C23C 28/00* (2006.01)
*H01L 39/14* (2006.01)
*C25D 7/06* (2006.01)
*H01B 12/06* (2006.01)

(52) U.S. Cl.
CPC .............. *C23C28/023* (2013.01); *C23C 28/322* (2013.01); *C23C 28/3455* (2013.01); *C25D 5/34* (2013.01); *C25D 7/0607* (2013.01); *H01L 39/143* (2013.01); *H01B 12/06* (2013.01); *Y02E 40/642* (2013.01); *Y10T 428/2933* (2015.01)

(56) References Cited

U.S. PATENT DOCUMENTS

2004/0266628 A1* 12/2004 Lee et al. .................... 505/238
2006/0012044 A1* 1/2006 Knop et al. .................. 257/750

FOREIGN PATENT DOCUMENTS

| JP | 63-042396 | 2/1988 | |
|---|---|---|---|
| JP | 07-335051 | * 12/1995 | ............ H01B 13/00 |
| JP | 2003-008307 | 1/2003 | |
| JP | 2006-331893 | 12/2006 | |

\* cited by examiner ary. The cable core and the superconductive cable are thereby improved in bending properties.
THIN FILM SUPERCONDUCTING WIRE AND SUPERCONDUCTING CABLE CONDUCTOR

TECHNICAL FIELD

The present invention relates to a thin film superconducting wire and a superconducting cable conductor, and more particularly to a thin film superconducting wire that protects a superconducting layer through the use of a residual stress within a thin film covering the superconducting layer from outside, and to a superconducting cable conductor.

BACKGROUND ART

A thin film superconducting wire including a laminated structure containing a superconducting layer is conventionally known. The thin film superconducting wire is wound longitudinally in a spiral manner around the surface of a cylindrical core material called a former, for example, to thereby implement a superconducting cable conductor. To achieve cost reduction, it is requested to reduce the outer diameter of a cross section that longitudinally intersects the superconducting cable conductor, to reduce the outer diameter of a cross section that longitudinally intersects the former, and to wind the thin film superconducting wire around the surface of the former. Accordingly, it is requested to wind the thin film superconducting wire while bending it with a large curvature relative to its longitudinal direction. Thus, during the winding, a larger bending stress is applied to the radially outer side (toward the outer peripheral side) of the former in the thin film superconducting wire.

For example, a plurality of cable cores constituting a superconducting cable disclosed in Japanese Patent Laying-Open No. 2006-331893 (Patent Document 1) indicated below has the following structure. Specifically, each cable core is configured to include a former positioned at the center of cable core, a first superconducting layer made of a superconducting wire wound around the outer periphery of the former (a superconducting wire with a superconducting filament covered by a stabilizing metal such as silver), an insulation layer located outside the first superconducting layer, and a second superconducting layer located outside the insulation layer. At a cross section that longitudinally intersects the cable core, the second superconducting layer located at the outer side has a diameter larger than that of the first superconducting layer located at the inner side. Thus, a bending stress applied to the first superconducting layer while winding the cable core around the surface of the former or insulation layer, for example, has a larger value than that applied to the second superconducting layer. Therefore, executed in Patent Document 1 is a process of making the tensile strength of the second superconducting layer to which a large bending stress is applied greater than that applied to the first superconducting layer by making the tensile strength of a material constituting the second superconducting layer greater than that of a material constituting the first superconducting layer (more specifically, by a method such as producing a covering layer such as a copper plating layer as a reinforcing member that covers the surface of the second superconducting layer, or bonding a tape layer as a reinforcing member to the second superconducting layer). The cable core and the superconducting cable are thereby improved in bending properties.

PRIOR ART DOCUMENTS

Patent Documents

Patent Document 1: Japanese Patent Laying-Open No. 2006-331893

SUMMARY OF THE INVENTION

Problems to be Solved by the Invention

The inventors considered subjecting a thin film superconducting wire including a laminated structure containing a superconducting layer to a metal plating treatment (more specifically, a copper plating treatment) such that the surface of the laminated structure is covered for the purpose of protecting the laminated structure and the like. A copper plating thin film produced on the surface of the laminated structure by the copper plating treatment serves to protect the superconducting layer against erosion and the like. Since this copper plating thin film is considered as corresponding to the covering layer of the second superconducting layer according to the aforementioned Patent Document 1, bending properties of the thin film superconducting wire with the copper plating thin film produced on its surface were studied assuming the thin film superconducting wire to be wound around a former. The results reveal that the thin film superconducting wire with the copper plating thin film produced on its surface was inferior in bending properties to a thin film superconducting wire having no copper plating thin film.

The present invention has been made to solve the above problems, and an object of the present invention is to provide a thin film superconducting wire with the copper plating thin film produced thereon and a superconducting cable having such thin film superconducting wire, which can be prevented from degrading in bending properties.

Means for Solving the Problems

Having studied intensely the aforementioned thin film superconducting wire with the copper plating thin film produced thereon, the inventors completed the present invention. More specifically, the inventors focused on a residual stress within the copper plating thin film produced on the thin film superconducting wire, which is not disclosed or suggested in Patent Document 1. Measuring the residual stress within the copper plating thin film reveals that the residual stress served as a tensile stress in a thin film superconducting wire having degraded bending properties.

In the case where the superconducting layer of the thin film superconducting wire is located at a radially outer side of the former when winding the thin film superconducting wire around the outer periphery of the former, a tensile stress will be applied to the superconducting layer. Then, when a copper plating thin film to which a tensile stress is applied as the aforementioned residual stress is present outside the laminated structure including the superconducting layer as described above, an additional tensile stress resulting from the aforementioned residual stress within the copper plating thin film will be applied to the superconducting layer. This in result promotes degradation in properties of the superconducting layer resulting from the added tensile stress, so that it is considered that the thin film superconducting wire degrades in bending properties (e.g., a critical bending diameter that allows bending while maintaining favorable superconducting properties increases).

Based on the above findings, a thin film superconducting wire according to the present invention includes a laminated structure having a substrate, a buffer layer located on one of main surfaces of the substrate, and a superconducting layer located on a main surface of the buffer layer opposite to the main surface facing the substrate. The thin film superconducting wire further includes a copper plating thin film covering an outer periphery of the laminated structure, a residual stress within the copper plating thin film serving as a compression stress.

The above-described thin film superconducting wire according to the present invention has a structure in which the copper plating thin film covers substantially the entire surface of the outer periphery of the laminated structure containing the superconducting layer. When winding the thin film superconducting wire of such structure around the surface of the former, for example, in such a manner that the superconducting layer faces the outside (opposite to the side facing the surface of the former), then, a tensile stress is applied to the superconducting layer and the copper plating thin film located outside similarly to the superconducting layer, in such a direction that the length of the thin film superconducting wire increases. At this stage, if a residual stress in the direction of compression exists within the copper plating thin film, a compression stress as a residual stress acting in the opposite direction to the above-described tensile stress associated with the winding and the tensile stress associated with the winding cancel each other out particularly within the copper plating thin film facing the outside, so that the tensile stress associated with the winding can be reduced (or if the residual stress has a sufficiently large value, the tensile stress associated with the winding is canceled out, so that a stress within the copper plating thin film serves as a compression stress). Accordingly, the copper plating thin film facing the outside can be less likely to apply a large tensile stress to the superconducting layer (or by applying a compression stress to the superconducting layer, the tensile stress associated with the winding within the superconducting layer can be reduced in value). This in result can suppress a mechanical deformation of the superconducting layer constituting the thin film superconducting wire due to the aforementioned tensile stress and a reduction in critical current Ic resulting from variations in composition arrangement, so that the thin film superconducting wire can be improved in electric properties and bending properties.

Preferably, in the above-described thin film superconducting wire, the laminated structure further includes sputtered silver layers located respectively on the other of the main surfaces of the substrate not facing the buffer layer and on a main surface of the superconducting layer not facing the buffer layer.

The sputtered silver layers serve as conducting layers through which a current conducts to the surface of the laminated structure during a plating treatment for producing the copper plating thin film constituting the thin film superconducting wire. Particularly, the sputtered silver layers are located respectively on the main surface of the superconducting layer (serving as the outermost surface) opposite to a main surface thereof facing the buffer layer and on the main surface of the substrate (serving as the outermost surface) opposite to a main surface thereof facing the buffer layer among the main surfaces constituting the laminated structure (the largest main surfaces among the surfaces). Then, flowing a current to the surface of the laminated structure through the pair of sputtered silver layers allows the plating treatment for producing the copper plating thin film to be conducted smoothly.

In particular, the above-described sputtered silver layer located on the main surface of the superconducting layer (serving as the outermost surface) acts as a protection layer for preventing the superconducting layer, for example, from being eroded by a plating solution and the like. Therefore, provision of the sputtered silver layer can reduce the likelihood that the superconducting layer may be damaged by the plating treatment.

Preferably, the above-described thin film superconducting wire further includes a silver covering layer covering the outer periphery of the laminated structure between the copper plating thin film and the laminated structure. The silver covering layer is a thin film layer produced before producing the copper plating thin film that covers the outer periphery of the laminated structure after producing the laminated structure, and serves to protect the superconducting layer and the like against a copper plating solution used for the copper plating treatment. Therefore, provision of the silver covering layer can increase flexibility in selection of the copper plating solution used for the copper plating treatment.

In the thin film superconducting wire provided with the silver covering layer, some of an excessive current flowing through the superconducting layer can be diverted and flown to the silver covering layer when a defect such as quenching occurs. This can prevent breakdown of the superconducting layer due to an excessive current flowing through the superconducting layer.

In the case where the superconducting cable, obtained by winding the above-described thin film superconducting wire around the surface of the former, for example, is wound such that the side at which the superconducting layer is located faces the outside, the tensile stress applied to the copper plating thin film at the side where the superconducting layer is located can be smaller by the compression stress as a residual stress within the copper plating thin film. This can reduce the likelihood that a large tensile stress may be applied to the superconducting layer. Since the thin film superconducting wire is thereby improved in electric properties and bending properties as described above, the superconducting cable can be improved in electric properties and bending properties.

Effects of the Invention

In the thin film superconducting wire according to the present invention, the residual stress within the copper plating thin film covering the outer periphery of the laminated structure serves as a compression stress. Accordingly, when winding the thin film superconducting wire such that the side at which the superconducting layer of the laminated structure is located faces the outside, the tensile stress applied to the copper plating thin film facing the outside similarly to the superconducting layer can be smaller by the compression stress which is the residual stress within the copper plating thin film. The thin film superconducting wire can thereby be improved in electric properties and bending properties.

MODES FOR CARRYING OUT THE INVENTION

Figure 1:
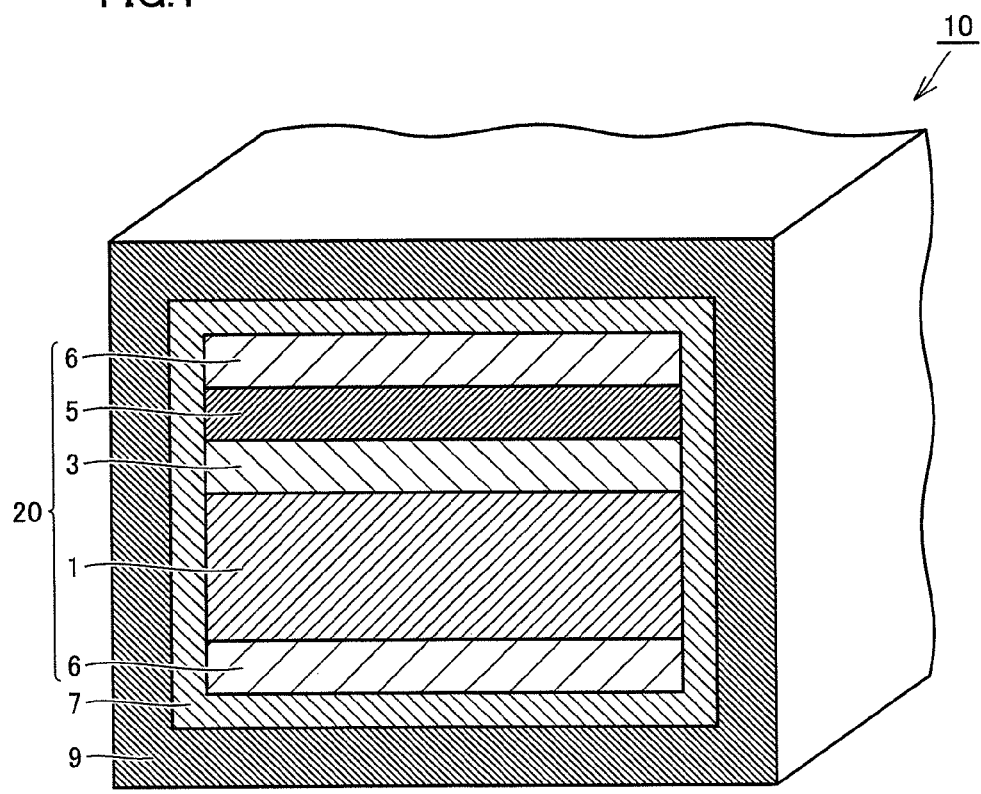
FIG. 1 is a schematic sectional view showing a structure of a thin film superconducting wire according to an embodiment of the present invention.

An embodiment of the present invention will be described below with reference to the drawings. In the present embodiment, like reference characters denote like parts having like function, and the same description will not be repeated unless necessary.

Figure 5:
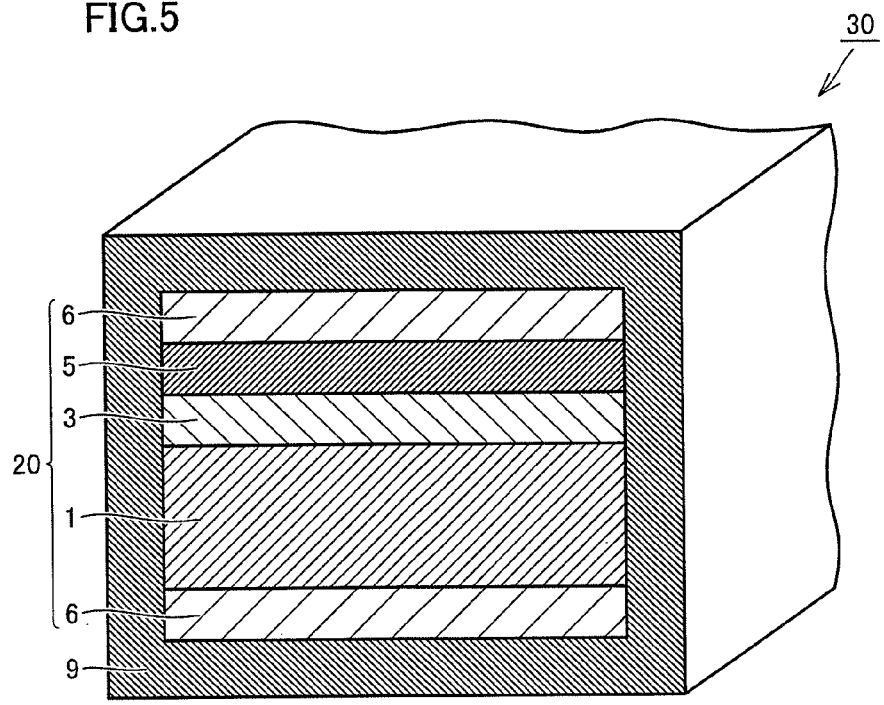
FIG. 5 is a schematic sectional view showing a structure of a thin film superconducting wire according to a first modification of the embodiment of the present invention.
Figure 6:
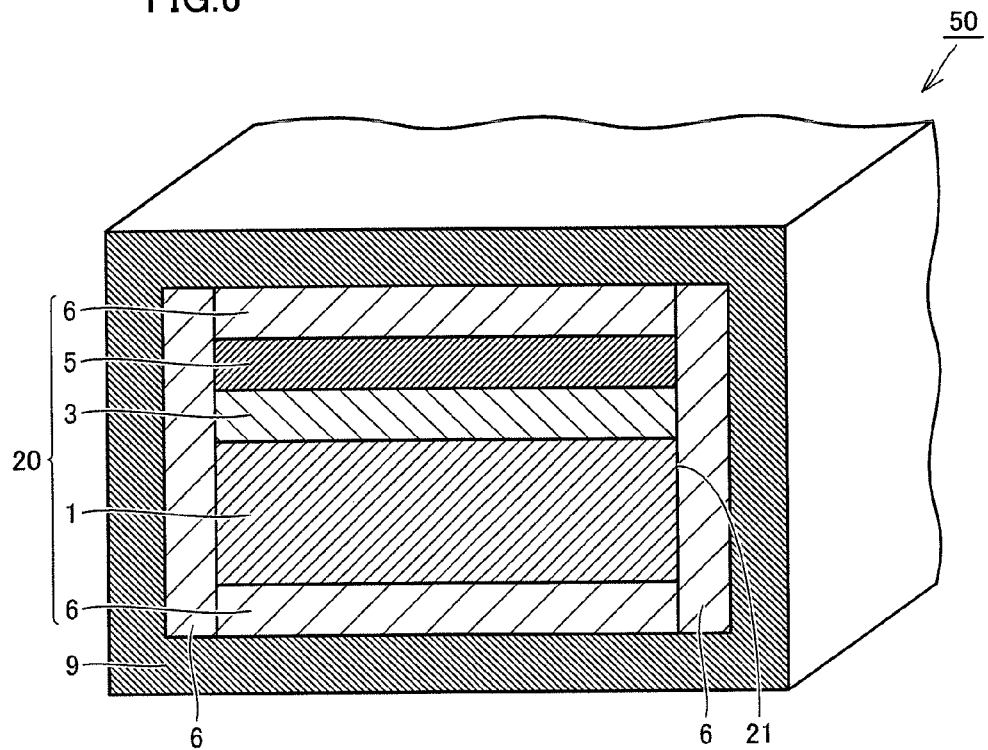
FIG. 6 is a schematic sectional view showing a structure of a thin film superconducting wire according to a second modification of the embodiment of the present invention.

FIGS. 1, 5, and 6 are schematic sectional views of a cross section taken in a direction intersecting the direction in which a thin film superconducting wire according to the present embodiment extends. Accordingly, the direction intersecting the sheet of drawing is assumed to be the longitudinal direction of a thin film superconducting wire 10, and a superconducting current is assumed to flow through a superconducting layer 5 in the direction intersecting the sheet of drawing. FIGS. 1, 5, and 6 show the cross section in rectangular shape with a small difference between the length in the vertical direction and that in the horizontal direction for easy understanding of the drawings, however, the vertical thickness of the cross section is actually much smaller than the horizontal width.

As shown in FIG. 1, thin film superconducting wire 10 according to the embodiment of the present invention has a long-length shape (tape-like shape) having a rectangular cross section, and herein the main surface is implemented by a surface having a relatively larger area extending in the longitudinal direction of the long-length shape. Thin film superconducting wire 10 includes a laminated structure 20, a silver covering layer 7 located so as to cover the outer periphery of laminated structure 20, and a copper plating thin film 9 located so as to cover the outer periphery of silver covering layer 7. Laminated structure 20 includes a substrate 1, a buffer layer 3 located on one of main surfaces of substrate 1, a superconducting layer 5 located on a main surface of buffer layer 3 (the upper main surface in FIG. 1) opposite to the main surface facing substrate 1, and sputtered silver layers 6. Sputtered silver layers 6 are located on the other main surface of substrate 1 (the lower main surface in FIG. 1) not facing buffer layer 3 and on a main surface of superconducting layer 5 (the upper main surface in FIG. 1) not facing buffer layer 3. More specifically, sputtered silver layers 6 are located so as to sandwich substrate 1, buffer layer 3 and superconducting layer 5 from the upper and lower main surfaces. In other words, substrate 1, buffer layer 3, superconducting layer 5, and sputtered silver layers 6 described above constitute laminated structure 20.

Substrate 1 preferably has a long-length shape (tape-like shape) having a rectangular cross section, made of Hastelloy® or a nickel-based alloy, for example. A length that thin film superconducting wire 10 extends in the extending direction is longer than or equal to 100 m, for example, and a length (width) thereof intersecting the extending direction is approximately 10 mm, for example. To increase the current density flowing through thin film superconducting wire 10, substrate 1 preferably has a smaller cross-sectional area. However, if the thickness of substrate 1 (in the vertical direction in FIG. 1) is too thin in order to reduce the cross-sectional area of substrate 1, the strength of substrate 1 may degrade. Accordingly, substrate 1 preferably has a thickness of approximately 0.1 mm, for example.

If superconducting layer 5 is located on the main surface of substrate 1, a polycrystalline thin film having an inferior orientation of crystal axes in the direction along the main surface of substrate 1 will be produced. In this case, it is difficult to increase the critical current density (Jc) of the thin film superconducting wire obtained. Therefore, buffer layer 3 is located between substrate 1 and superconducting layer 5. Buffer layer 3 is preferably implemented by a material such as $Gd_2Zr_2O_7$ (oxide of Gd (gadolinium) and Zr (zirconium)), $CeO_2$ (cerium oxide), or YSZ (yttria-stabilized zirconia). Implementing buffer layer 3 by such a material facilitates aligning crystal axes of superconducting layer 5 located on the main surface of buffer layer 3.

Superconducting layer 5 is a thin film layer through which a superconducting current flows in thin film superconducting wire 10, and is preferably made of, for example, an yttrium-based ($YBa_2Cu_3O_x$) thin film that is a superconducting material. To improve the value of critical current Ic of the superconducting current flowing through superconducting layer 5, superconducting layer 5 preferably has a thickness greater than or equal to 0.1 μm and smaller than or equal to 10 μm.

Sputtered silver layer 6 located on the main surface of superconducting layer 5 is a silver thin film produced by a sputtering method, and preferably has a thickness greater than or equal to 0.1 μm and smaller than or equal to 50 μm. However, sputtered silver layer 6 can be implemented by a silver thin film obtained by any method other than sputtering.

Sputtered silver layer 6 located on the main surface of superconducting layer 5 is provided as a protection layer for preventing superconducting layer 5 from being damaged by erosion and the like. As shown in FIG. 1, besides on the main surface of superconducting layer 5, sputtered silver layer 6 is also provided on the lower main surface of substrate 1, so that both sputtered silver layers 6 are located to sandwich substrate 1, buffer layer 3, and superconducting layer 5. Then, when conducting a plating treatment for producing copper plating thin film 9, an electrode of a system of conducting the plating treatment and laminated structure 20 can be easily brought into conduction through sputtered silver layers 6.

Silver covering layer 7 is located so as to cover the outer periphery of laminated structure 20 including sputtered silver layers 6, that is, so as to cover substantially the entire surface of the outermost surface of laminated structure 20. Silver covering layer 7 is a silver thin film produced by plating, for example, and preferably has a thickness greater than or equal to 0.1 μm and smaller than or equal to 50 μm.

Locating silver covering layer 7 so as to cover substantially the entire surface of the outermost surface of laminated structure 20 can facilitate the plating treatment for producing copper plating thin film 9 on laminated structure 20 including silver covering layer 7. In other words, copper plating thin film 9 is located on the outer surface of silver covering layer 7. When silver covering layer 7 has the above-described thickness, the following effects can be achieved. More specifically, while immersing laminated structure 20 into a copper plating solution during the plating treatment, the surface of superconducting layer 5 is not in direct contact with the copper plating solution because the surface of superconducting layer 5 is covered by silver covering layer 7. The presence of silver covering layer 7 can thereby reduce the likelihood that the surface and the inside of superconducting layer 5 may be affected by, for example, erosion caused by the copper plating solution. Since the surface of laminated structure 20 is covered by silver covering layer 7, there is no need to consider whether superconducting layer 5 will be eroded or not when selecting the copper plating solution, which can improve flexibility in selection of the copper plating solution used for the copper plating treatment.

In addition, providing thin film superconducting wire 10 with silver covering layer 7 allows some of an excessive current flowing through superconducting layer 5 to be diverted and flown to silver covering layer 7 when a defect such as quenching occurs in superconducting layer 5, for example. This can prevent breakdown of superconducting layer 5 due to an excessive current flowing through superconducting layer 5.

Copper plating thin film 9 is located so as to cover the outer periphery of above-described silver covering layer 7, that is, so as to cover substantially the entire surface of the outermost surface of silver covering layer 7. Copper plating thin film 9 is a copper thin film produced by plating, and preferably has a thickness greater than or equal to 0.1 μm and smaller than or equal to 50 μm.

In copper plating thin film 9 of thin film superconducting wire 10, a residual stress existing therein serves as a compression stress. More specifically, it is in a state where force is applied to a region in the direction along which copper plating thin film 9 extends, for example, that is, in the longitudinal direction of thin film superconducting wire 10, the force being applied in such a direction that the longitudinal length of thin film superconducting wire 10 is reduced.

Figure 2:
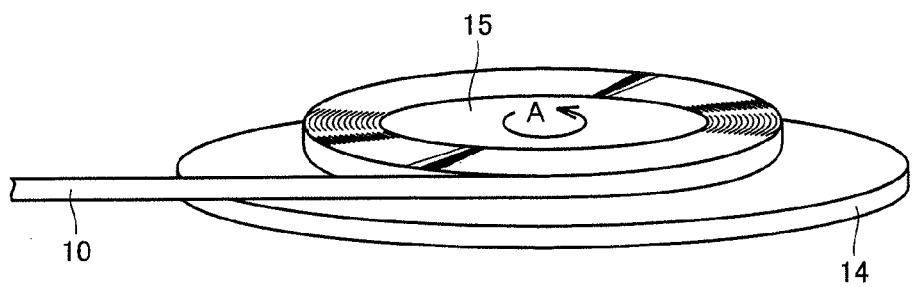
FIG. 2 is a perspective view showing a step of winding the thin film superconducting wire according to the embodiment of the present invention in a pancake manner.
Figure 3:
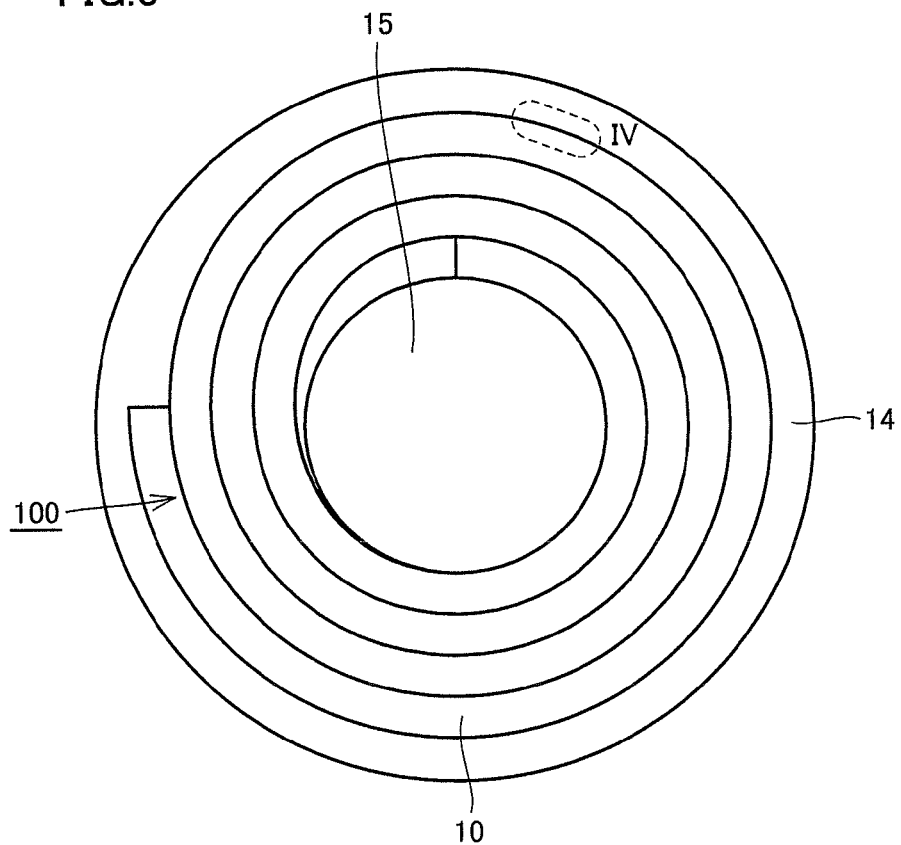
FIG. 3 is a plan view showing a state in which the thin film superconducting wire according to the embodiment of the present invention is wound in a pancake manner.

By way of example, as shown in FIGS. 2 and 3, consider the case in which thin film superconducting wire 10 is wound in a pancake manner (like a coil). More specifically, thin film superconducting wire 10 is wound around reel 15 located on a flat plate 14 in the direction of a rotating arrow (direction A) on reel 15 shown in FIG. 2, to constitute a coil 100. At this state, winding is performed such that superconducting layer 5 is located at the outer side of winding of one thin film superconducting wire 10 surrounded by a dotted line in FIG. 3 (at the upper side in FIG. 1) as shown in an enlarged view of FIG. 4, and such that substrate 1 is located at the inner side of winding of that thin film superconducting wire 10 (at the lower side in FIG. 1). Thus, in thin film superconducting wire 10 wound as shown in FIGS. 2 and 3, the side at which substrate 1 is located faces reel 15, and the side at which superconducting layer 5 is located faces the outside of winding, not facing reel 15.

Figure 4:
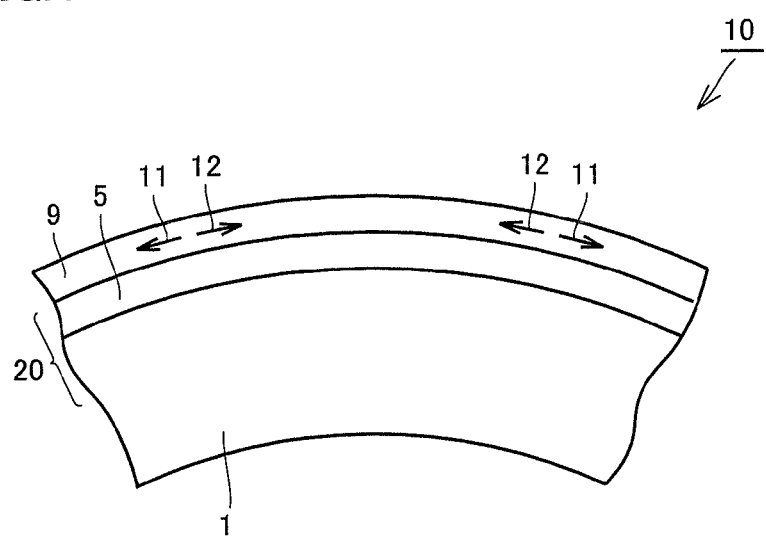
FIG. 4 is an enlarged view of a region "IV" in FIG. 3.

In this case, as shown in FIG. 4, a tensile stress is applied to the outer side of winding of thin film superconducting wire 10 such that the length extending in the longitudinal direction is longer than at the inner side of winding. Accordingly, a tensile stress 11 shown in FIG. 4 is applied to the main surface of copper plating thin film 9 located at the outer side of winding at the side where superconducting layer 5 is located. Then, a stress caused by tensile stress 11 is also applied to superconducting layer 5 located in proximity to copper plating thin film 9 to which tensile stress 11 is applied. However, as described above, a compression stress 12 shown in FIG. 4 exists as a residual stress in copper plating thin film 9 of thin film superconducting wire 10. Since tensile stress 11 and compression stress 12 act in opposite directions to cancel each other out, the magnitude of tensile stress 11 is reduced by compression stress 12 (or when compression stress 12 is sufficiently great, tensile stress 11 is completely canceled out).

For example, when winding thin film superconducting wire 10, an increase in the tensile stress acting on copper plating thin film 9 located on the main surface at the outer side of winding may cause stress concentrations locally in superconducting layer 5 located at the outer side of winding and the like due to the increased tensile stress in copper plating thin film 9. If a great stress is applied to superconducting layer 5, critical current Ic in superconducting layer 5 decreases in value. In addition, if superconducting layer 5 is broken as a result of the occurrence of stress concentrations and the like in the superconducting layer, a superconducting current can no longer be flown through superconducting layer 5.

In the case of thin film superconducting wire 10 according to the present invention, however, tensile stress 11 within copper plating thin film 9 caused by winding decreases because of the presence of compression stress 12 as a residual stress within copper plating thin film 9 acting in the opposite direction to tensile stress 11. This can suppress degradation of superconducting layer 5 resulting from tensile stress 11, and suppress reduction in the superconducting current (critical current Ic) that can be flown through superconducting layer 5. Therefore, thin film superconducting wire 10 can be improved in electric properties and bending properties. More specifically, thin film superconducting wire 10 has a large critical current Ic and offers high performance (with a great curvature which is a bending limit).

A thin film superconducting wire 30 shown in FIG. 5 is a modification of above-described thin film superconducting wire 10 shown in FIG. 1, and basically has an aspect similar to that of thin film superconducting wire 10. However, thin film superconducting wire 30 is not provided with silver covering layer 7.

The aspect of thin film superconducting wire 30 is different from that of thin film superconducting wire 10 merely in the following point. That is, with respect to other elements, thin film superconducting wire 30 has an aspect similar to that of thin film superconducting wire 10. More specifically, a residual stress within copper plating thin film 9 of thin film superconducting wire 30 also serves as a compression stress similarly to copper plating thin film 9 of thin film superconducting wire 10. This achieves the effect of reducing a tensile stress by the action of the compression stress even when the tensile stress is applied to copper plating thin film 9 at the side where superconducting layer 5 is located, thereby preventing superconducting layer 5 from degrading. Therefore, the thin film superconducting wire according to the present embodiment may be implemented by the aspect of thin film superconducting wire 30.

A silver crystal is a stable cubic, whose melting point is as high as 961° C. However, silver has a characteristic that, when heated, easily starts being softened even at low temperatures below its melting point. For example, in the case of providing thin film superconducting wire 10, silver covering layer 7 is heated by conduction through silver covering layer 7 in the process of conducting the plating treatment for producing copper plating thin film 9 after producing silver covering layer 7. Then, silver covering layer 7 may be softened by heating and may be deformed.

In thin film superconducting wire 30, the absence of silver covering layer 7 can avoid defects associated with softening of silver covering layer 7 during the above-described plating treatment. In the step of producing thin film superconducting wire 30 shown in FIG. 5, sputtered silver layers 6 can be utilized to facilitate conduction between laminated structure 20 and the electrode of the system of conducting the plating treatment for producing copper plating thin film 9.

A thin film superconducting wire 50 shown in FIG. 6 is a modification of above-described thin film superconducting wire 30 shown in FIG. 5, and basically has an aspect similar to that of thin film superconducting wire 30. However, thin film superconducting wire 50 is provided with sputtered silver layers 6 also in the direction intersecting the main surface of laminated structure 20 (in the vertical direction in FIG. 6, i.e., on the side surfaces of laminated structure 20) in addition to those along the main surface of laminated structure 20.

The aspect of thin film superconducting wire 50 is different from that of thin film superconducting wire 30 merely in the following point. That is, with respect to other elements, thin film superconducting wire 50 has an aspect similar to that of thin film superconducting wire 30. More specifically, a residual stress within copper plating thin film 9 of thin film superconducting wire 50 also serves as a compression stress similarly to copper plating thin film 9 of thin film superconducting wire 10. This achieves the effect of reducing a tensile stress by the action of the compression stress even when the tensile stress is applied to copper plating thin film 9 at the side where superconducting layer 5 is located, thereby preventing superconducting layer 5 from degrading. Therefore, the thin film superconducting wire according to the present embodiment may be implemented by the aspect of thin film superconducting wire 50.

By providing sputtered silver layers 6 also in the direction intersecting the main surface of laminated structure 20 (in the vertical direction in FIG. 6) in addition to those along the main surface of laminated structure 20, sputtered silver layers 6 are configured to cover substantially the entire surface of the outer periphery of laminated structure 20 similarly to silver covering layer 7. Therefore, similarly to silver covering layer 7, they serve as protection layers for reducing the likelihood that a defect such as erosion of superconducting layer 5 by a copper plating solution may occur during the plating treatment for producing copper plating thin film 9.

Further, similarly to above-described silver covering layer 7, sputtered silver layers 6 in thin film superconducting wire 50 can play the role (as a stabilization layer) to divert and flow some of an excessive current flowing through superconducting layer 5 when a defect such as quenching occurs in superconducting layer 5, for example. This can prevent breakdown of superconducting layer 5 due to an excessive current flowing through superconducting layer 5.

In the case of producing sputtered silver layers 6 on the entire periphery of laminated structure 20 similarly to silver covering layer 7 (cf. FIG. 1) as in thin film superconducting wire 50, it is preferable to form sputtered silver layers 6 thicker than sputtered silver layers 6 in thin film superconducting wire 10, for example. More specifically, the thickness is preferably greater than or equal to 0.5 µm and smaller than or equal to 50 µm.

A superconducting cable conductor obtained by using above-described thin film superconducting wire 10, 30, or 50 will now be described.

Figure 7:
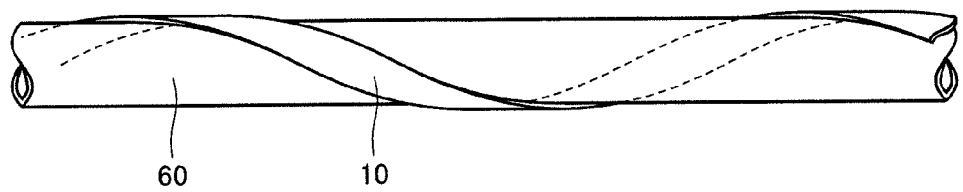
FIG. 7 is a schematic sectional view showing a manner in which the superconducting thin film wire according to the embodiment of the present invention is wound around a former.
Figure 8:
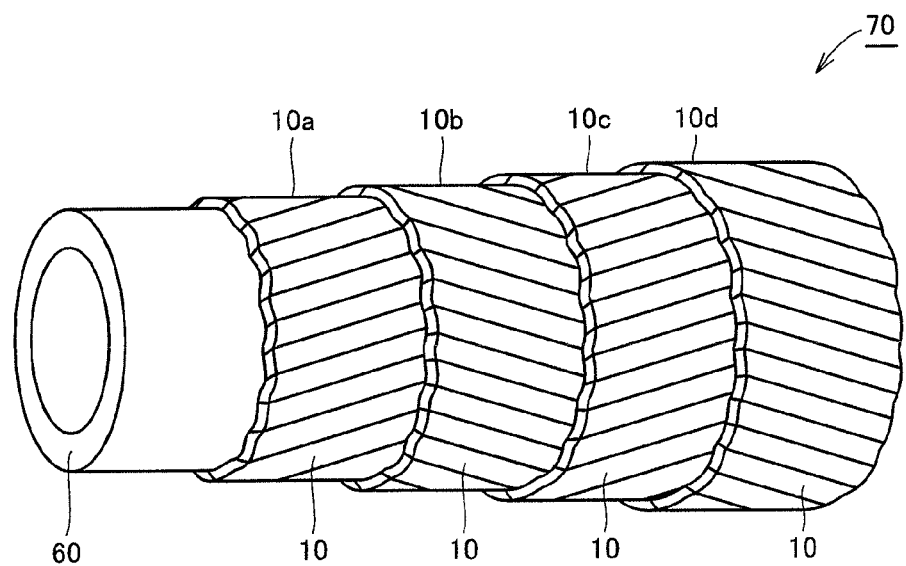
FIG. 8 is a schematic sectional view showing a structure of a superconducting cable conductor according to the embodiment of the present invention.

In the case of using thin film superconducting wire 10, for example, thin film superconducting wire 10 is wound in a spiral manner around the outer peripheral surface of a cylindrical former 60, as shown in FIG. 7. In this manner, a plurality of superconducting wires 10 are laminated in multiple layers on former 60 to constitute a superconducting cable conductor 70 shown in FIG. 8. As described above, thin film superconducting wire 10 is wound such that superconducting layer 5 is located at the outer side of winding of each thin film superconducting wire 10 (at the upper side in FIG. 1), and such that substrate 1 is located at the inner side of winding of thin film superconducting wire 10 (at the lower side in FIG. 1). Thus, in thin film superconducting wire 10 wound as shown in FIGS. 7 and 8, the side at which substrate 1 is located faces the outer peripheral surface of former 60, and the side at which superconducting layer 5 is located faces the outside of winding, not facing former 60. Then, as described above, tensile stress 11 (cf. FIG. 4) applied to the main surface of copper plating thin film 9 at the side where superconducting layer 5 of thin film superconducting wire 10 is located is reduced by compression stress 12 (cf. FIG. 4) within copper plating thin film 9. This reduces the stress applied to superconducting layer 5 of thin film superconducting wire 10, which can avoid defects such as a reduction in critical current Ic due to degradation and breakdown of thin film superconducting wire 10, thereby improving the electric properties and bending properties.

As shown in FIG. 8, thin film superconducting wires 10 are wound such that the respective layers are in alternately different directions: for example, a first layer 10a is wound clockwise in the drawing; a second layer 10b wound counterclockwise in the drawing; a third layer 10c wound clockwise in the drawing; and a fourth layer 10d wound counterclockwise in the drawing. The directions of winding first layer 10a to fourth layer 10d are not limited to these, but may be wound in any direction. For example, first layer 10a and second layer 10b may be wound clockwise in the drawing, and third layer 10c and fourth layer 10d may be wound counterclockwise in the drawing, or first layer 10a to fourth layer 10d may all be wound in a single direction.

Figure 9:
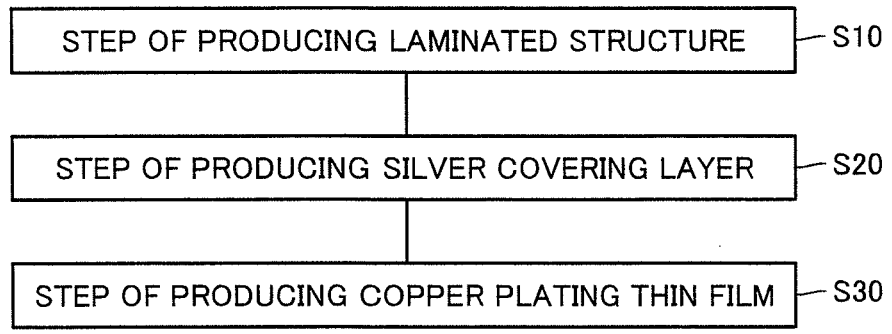
FIG. 9 is a flow chart showing a method of manufacturing the thin film superconducting wire according to the embodiment of the present invention.
Figure 10:
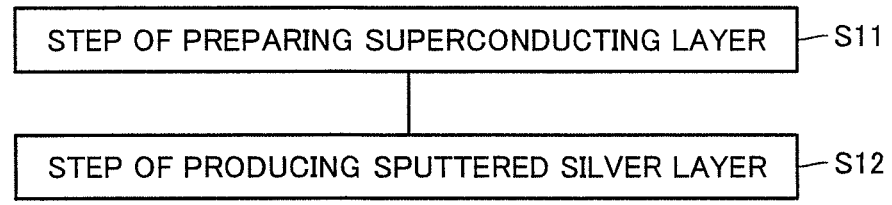
FIG. 10 is a flow chart showing detailed steps in a step (S10) of the flow chart of FIG. 9.

A method of producing the thin film superconducting wire according to the present embodiment described above will now be described. As shown in the flow chart of FIG. 9, a step (S10) of producing a laminated structure is executed first. More specifically, it is a step of producing laminated structure 20 of each of the thin film superconducting wires shown in FIGS. 1, 5 and 6. Further specifically, the step (S10) of producing the laminated structure includes a step (S11) of preparing a superconducting layer and a step (S12) of producing a sputtered silver layer, as shown in the flow chart of FIG. 10.

The step (S11) of preparing a superconducting layer will now be described specifically. To prepare superconducting layer 5, a structure in which substrate 1 and buffer layer 3 are laminated is prepared first. As a method of producing buffer layer 3 on one of the main surfaces of substrate 1, an IBAD (Ion Beam Assisted Deposition) method, a PLD (Pulsed Laser Deposition) method, or sputtering can be employed. Using these methods, superconducting layer 5 located on the main surface of buffer layer 3 can be improved in crystal orientation. Buffer layer 3 may be a single layer, or may be implemented by laminating a plurality of layers.

Superconducting layer 5 is then produced on the main surface of buffer layer 3. Superconducting layer 5 is preferably implemented by a thin film made of an yttrium-based ($YBa_2Cu_3O_x$) superconductor, for example, using the PLD method, a high-frequency sputtering method, or a MOD (Metal Organic Deposition) method.

In the next step (S12) of producing the sputtered silver layers, sputtered silver layers 6 are preferably produced by sputtering, but can be implemented by silver thin films produced by any method other than sputtering, as described above. In the case of providing thin film superconducting wire 50 shown in FIG. 6, the step of producing sputtered silver layers 6 on the main surfaces of laminated structure 20 is followed by a step of producing sputtered silver layers 6 on the side surfaces of laminated structure 20. In the step of producing sputtered silver layers 6 on the side surfaces of laminated structure 20, any method can be employed such as locating the main surfaces of laminated structure 20 in an inclined manner relative to a target material of sputtering such that the end faces of laminated structure 20 face the target material of sputtering. Sputtered silver layers 6 may be produced simultaneously both on the main surfaces and side surfaces of laminated structure 20. In this case, the inclination angle of the main surfaces of laminated structure 20 relative to the target material may be adjusted appropriately such that sputtered silver layers 6 are produced simultaneously both on one of the main surfaces (e.g., the outermost surface of superconducting layer 5) and one of the side surfaces of laminated structure 20.

In the case of providing thin film superconducting wire 10, a step (S20) of producing a silver covering layer is then executed. More specifically, it is a step of producing silver covering layer 7 shown in FIG. 1, which is preferably implemented by a vacuum deposition method or a sputtering method. The step (S20) of producing a silver covering layer is omitted in the case of providing thin film superconducting wire 30 or 50.

Then, copper plating thin film 9 is produced in a step (S30) of producing a copper plating thin film. More specifically, the step (S30) of producing a copper plating thin film includes a step (S31) of preparing a copper plating solution, a step (S32) of adding an additive and a step (S33) of conducting a plating treatment, as shown in a flow chart of FIG. 11.

The copper plating solution used for immersing laminated structure 20 therein to obtain copper plating thin film 9 is preferably implemented by a solution obtained by dissolving copper sulfate in a sulfuric acid solution or a solution obtained by dissolving copper pyrophosphate in liquid ammonia, for example. In order for the residual stress within copper plating thin film 9 to serve as a stress in the compression direction, the electrolyte obtained by dissolving copper pyrophosphate in liquid ammonia is more preferable. To prevent erosion of the surface of superconducting layer 5 constituting laminated structure 20 during immersion of laminated structure 20, the use of the solution obtained by dissolving copper sulfate in sulfuric acid is more preferable.

Figure 11:
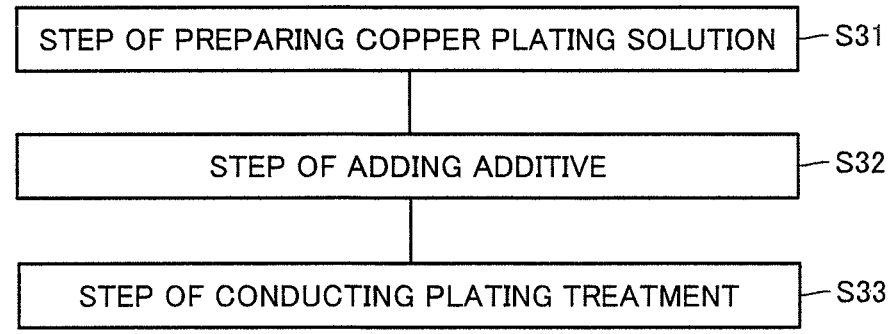
FIG. 11 is a flow chart showing detailed steps in a step (S30) of the flow chart of FIG. 9.

The copper plating solution prepared as described above is subjected to the step (S32) of adding an additive as shown in FIG. 11. More specifically, it is a step of adding an additive to the copper plating solution in order to improve the smoothness and glossiness of the surface of copper plating thin film 9 obtained.

The additive can be implemented by an organic compound-based material such as polyethylene glycol or a surfactant. However, the smoothness and glossiness of the surface of copper plating thin film 9 can be greatly improved by using thiourea as the additive. The use of thiourea as the additive also allows the residual stress within copper plating thin film 9 to serve as a stress in the compression direction. Accordingly, it is preferable to add thiourea to a solution obtained by dissolving copper sulfate in sulfuric acid, for example (e.g., a solution having a copper sulfate concentration greater than or equal to 60 g/l (litter) and smaller than or equal to 150 g/l and a sulfuric acid concentration greater than or equal to 100 g/l and smaller than or equal to 220 g/l) such that thiourea has a concentration greater than or equal to 8 ppm and smaller than or equal to 12 ppm. This allows the residual stress within copper plating thin film 9 to serve as a stress in the compression direction even when the copper plating solution is implemented by the solution obtained by dissolving copper sulfate in sulfuric acid.

Then, in the step (S33) of conducting a plating treatment, laminated structure 20 is immersed into the copper plating solution, with the additive having been added thereto, constituting the system of conducting the plating treatment. Sputtered silver layers 6 or silver covering layer 7 of laminated structure 20 is then connected to an electrode (cathode) for the plating treatment placed in the copper plating solution. Utilizing an electrolytic phenomenon caused by applying a voltage to electrodes (cathode and anode) to flow a current, copper plating thin film 9 is produced on the surface of laminated structure 20 connected to the cathode. The current flowing through the cathode at this stage can have a value greater than or equal to 1 A/dm$^2$ and smaller than or equal to 10 A/dm$^2$, and more preferably 5 A/dm$^2$, for example.

In the step (S33) of conducting the plating treatment, when implementing the copper plating solution by a solution obtained by dissolving copper sulfate in sulfuric acid, for example, the plating bath preferably has a temperature higher than or equal to 20° C. and lower than or equal to 30° C., and when implementing the copper plating solution by a solution obtained by dissolving copper pyrophosphate in liquid ammonia, for example, the plating bath preferably has a temperature higher than or equal to 50° C. and lower than or equal to 60° C.

By executing the above-described respective steps, thin film superconducting wire 10, 30, or 50 having copper plating thin film 9 whose internal residual stress serves as a compression stress can be obtained.

FIRST EXAMPLE

Figure 12:
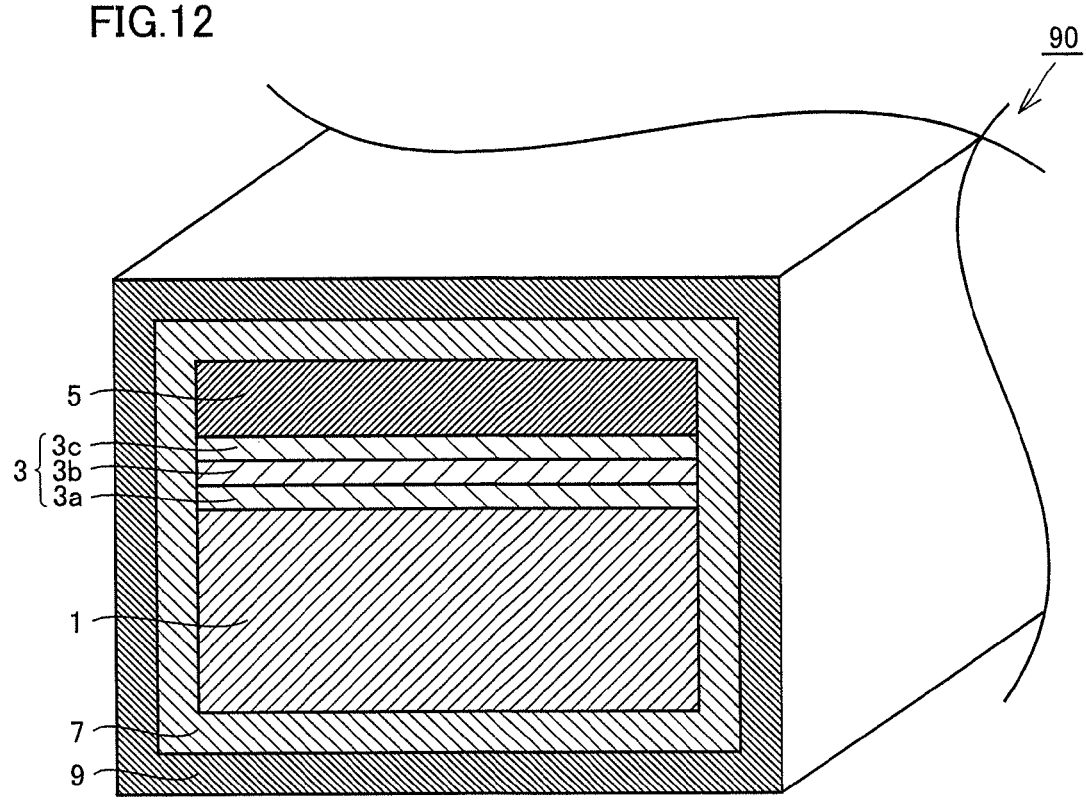
FIG. 12 is a schematic sectional view showing a structure of the thin film superconducting wire according to the present embodiment.

A thin film superconducting wire 90 shown in FIG. 12 with copper plating thin film 9 produced using a plating solution as a copper plating solution obtained by dissolving copper sulfate in a sulfuric acid medium was produced, and subjected to a test to examine a residual stress within copper plating thin film 9 of thin film superconducting wire 90.

Herein, three kinds of copper plating solutions A, B, and C were prepared in accordance with concentrations of copper sulfate pentahydrate (CuSO$_4$.5H$_2$O) dissolved in the sulfuric acid medium. Silver covering layer 7 covering substantially the entire surface of the outer periphery of laminated structure 20 of thin film superconducting wire 10 shown in FIG. 1 was located to be connected to the cathode of the system of conducting the plating treatment, so that the plating treatment by electrolysis was conducted. Besides adding thiourea as the additive, a small amount of chloride ion was added to copper plating solutions A, B, and C so as to prevent the copper plating solutions from eroding laminated structure 20.

A target material of the plating treatment for producing copper plating thin film 9 was prepared as indicated below. As shown in FIG. 12, CeO$_2$ in 0.1 μm thickness, YSZ in 0.3 μm thickness and CeO$_2$ in 0.1 μm thickness as a first buffer layer 3a, a second buffer layer 3b, and a third buffer layer 3c, respectively, were sequentially produced by a RF sputtering method on one of the main surfaces of a tape-like substrate as substrate 1 made of nickel-tungsten alloy having a width of 10 mm and a thickness of 80 μm. These first buffer layer 3a, second buffer layer 3b, and third buffer layer 3c constitute buffer layer 3. The surface of a structure in which 2-μm-thick superconducting layer 5 made of RE123 (REBa$_2$Cu$_3$O$_{7-\delta}$) had been produced on third buffer layer 3c using the PLD method was subjected to a DC sputtering method to produce silver covering layer 7. Silver covering layer 7 had a thickness of 8 μm on the main surface of superconducting layer 5, a thickness of 2 μm on the main surface of substrate 1 and a thickness of 3 μm on both side surfaces along the direction of lamination.

Copper plating thin film 9 was produced under various conditions shown in Table 1 in which these concentrations of copper sulfate, current density flown through the cathode in the plating treatment, and time for the plating treatment were varied. As a result, 20-μm-thick copper plating thin film 9 was obtained. The direction and magnitude of a residual stress within copper plating thin film 9 of thin film superconducting wire 10 thus obtained were measured, the results of which are given in Table 1 below. It is to be noted that the residual stress was evaluated using an X-ray stress measurement device.

plating time of 18 min had an internal residual stress of 300 MPa in the direction of compression.

TABLE 1

| Copper Plating Solution | Amount of Copper Sulfate in Sulfuric Acid (g/L) | Concentration of Sulfuric Acid (g/L) | Amount of Chloride Ions (ppm) | Additive | Current Density (A/dm$^2$) | Plating Time (min) | Plating Bath Temperature (° C.) | Direction of Residual Stress | Magnitude of Residual Stress (MPa) |
|---|---|---|---|---|---|---|---|---|---|
| A | 75 | 190 | 75 | Thiourea 10 ppm | 5 | 18 | 25 | Tension | 3 |
|   |    |     |    |         | 10 | 9  |    | Tension | 5 |
| B | 100 | 150 |   |         | 10 | 9  |    | Tension | 6 |
| C | 150 | 100 |   |         | 10 | 9  |    | Compression | 4 |
|   |     |     |   |         | 15 | 6  |    | Tension | 35 |

Table 1 reveals the result that copper plating thin film 9 of thin film superconducting wire 10 obtained by conducting the plating treatment using copper plating solution C with a current density of 10 A/dm$^2$ for a plating time of 9 min had an internal residual stress of 4 MPa in the direction of compression.

SECOND EXAMPLE

Thin film superconducting wire 90 with copper plating thin film 9 produced using an electrolyte as a copper plating solution obtained by dissolving copper pyrophosphate in liquid ammonia was produced, and subjected to a test to examine a residual stress within copper plating thin film 9 of thin film superconducting wire 90.

Herein, a copper plating solution D obtained by dissolving copper pyrophosphate in liquid ammonia was prepared. A target material of the plating treatment was implemented by a material having the same structure as that used in above-described First Example. Silver covering layer 7 covering substantially the entire surface of the outer periphery of laminated structure 20 of thin film superconducting wire 90 shown in FIG. 12 was located to be connected to the cathode of the system of conducting the plating treatment, so that the plating treatment by electrolysis was conducted. Besides copper pyrophosphate, potassium pyrophosphate which was potassium salt having a high solubility containing phosphate ions was dissolved in copper plating solution D. This is for ensuring the amount of phosphate ions dissolved in the electrolyte of copper plating solution D.

Copper plating thin film 9 was produced using copper plating solution D thus prepared under conditions shown in Table 2 below, similarly to First Example. The direction and magnitude of a residual stress within copper plating thin film 9 of thin film superconducting wire 90 thus obtained were measured, the results of which are given in Table 2 below.

TABLE 2

| Copper Plating Solution | Amount of Copper Pyrophosphate in Liquid Ammonia (g/L) | Amount of Potassium Pyrophosphate in Liquid Ammonia (g/L) | Concentration of Liquid Ammonia (mL/L) | PH of Electrolyte | P Ratio of Electrolyte | Current Density (A/dm$^2$) | Plating Time (min) | Plating Bath Temperature (° C.) | Direction of Residual Stress | Magnitude of Residual Stress (MPa) |
|---|---|---|---|---|---|---|---|---|---|---|
| D | 84 | 350 | 2 | 8.5 | 7.5 | 5 | 18 | 55 | Compression | 300 |

The P ratio in Table 2 is a value representing a weight ratio of pyrophosphate ions to copper ions in the electrolyte of copper plating solution D. Table 2 reveals the result that copper plating thin film 9 of thin film superconducting wire 90 obtained by conducting the plating treatment using copper plating solution D with a current density of 5 A/dm$^2$ for a Therefore, it can be said that, when implementing the copper plating solution by a copper pyrophosphate solution, copper plating thin film 9 having a residual stress in the direction of compression can be obtained without adding an additive.

It should be construed that the embodiments disclosed herein are by way of illustration in all respects and not intended to be limiting. It is intended that the scope of the present invention is defined by claims, not by the description above, and includes all modifications and variations equivalent in meaning and scope to the claims.

Industrial Applicability

The present invention is particularly favorable as a technique of improving a thin film superconducting wire in electric properties and bending properties.

Description of the Reference Signs

1 substrate; 3 buffer layer; 3a first buffer layer; 3b second buffer layer; 3c third buffer layer; 5 superconducting layer; 6 sputtered silver layer; 7 silver covering layer; 9 copper plating thin film; 10, 30, 50, 90 thin film superconducting wire; 10a first layer; 10b second layer; 10c third layer; 10d fourth layer; 11 tensile stress; 12 compression stress; 14 flat plate; 15 reel; 20 laminated structure; 60 former; 70 superconducting cable conductor; 100 coil.

The invention claimed is:

1. A thin film superconducting wire comprising:
   a laminated structure including,
      a substrate,
      a buffer layer located on one of main surfaces of said substrate, and
      a superconducting layer located on a main surface of said buffer layer opposite to a main surface facing said substrate; and
   a copper plating thin film covering an outer periphery of said laminated structure, a residual stress within said copper plating thin film being a compression stress in a direction along the longitudinal extension of the thin film superconducting wire when the wire is in an unbent state, wherein
   the copper plating film is plated to the outer periphery by a solution obtained by dissolving copper sulfate pentahydrate in a sulfuric acid, wherein the solution has a copper sulfate concentration greater than or equal to 60 g/l and smaller than or equal to 150 g/l and a sulfuric acid concentration greater than or equal to 100 g/l and smaller than or equal to 220 g/l, and a thiourea concentration greater than or equal to 8 ppm and smaller than or equal to 12 ppm.

2. The thin film superconducting wire according to claim 1, wherein said laminated structure further includes sputtered silver layers located respectively on the other of the main surfaces of the substrate not facing said buffer layer and on a main surface of said superconducting layer not facing said buffer layer.

3. The thin film superconducting wire according to claim 1, further comprising a silver covering layer covering the outer periphery of said laminated structure between said copper plating thin film and said laminated structure.

4. The thin film superconducting wire according to claim 1, wherein the compression stress is greater than or equal to 4 MPa and is less than or equal to 300 MPa.

5. A superconducting cable conductor comprising the thin film superconducting wire as defined in claim 1.

\* \* \* \* \*